United States Patent
Kalte et al.

(10) Patent No.: US 10,318,687 B2
(45) Date of Patent: Jun. 11, 2019

(54) IMPLEMENTING A CONSTANT IN FPGA CODE

(71) Applicant: dSPACE digital signal processing and control engineering GmbH, Paderborn (DE)

(72) Inventors: Heiko Kalte, Paderborn (DE); Lukas Funke, Paderborn (DE)

(73) Assignee: dSPACE digital signal processing and control engineering GmbH, Paderborn (DE)

( * ) Notice: Subject to any disclaimer, the term of this patent is extended or adjusted under 35 U.S.C. 154(b) by 731 days.

(21) Appl. No.: 14/753,439

(22) Filed: Jun. 29, 2015

(65) Prior Publication Data

US 2015/0379178 A1    Dec. 31, 2015

(30) Foreign Application Priority Data

Jun. 30, 2014    (EP) .................................... 14174904

(51) Int. Cl.
*G06F 7/60*      (2006.01)
*G06F 17/10*      (2006.01)
*G06F 17/50*      (2006.01)
*G06F 8/30*      (2018.01)

(52) U.S. Cl.
CPC ............ *G06F 17/5054* (2013.01); *G06F 8/30* (2013.01); *G06F 17/5045* (2013.01)

(58) Field of Classification Search
CPC combination set(s) only.
See application file for complete search history.

(56) References Cited

U.S. PATENT DOCUMENTS 6,703,859 B2 *   3/2004   Kumamoto ...... H03K 19/17736
                                                                                                    326/38
6,907,595 B2     6/2005   Curd et al.
(Continued)

FOREIGN PATENT DOCUMENTS

WO    WO 2009/009082 A2    1/2009

OTHER PUBLICATIONS

Xilinx, 7 Series FPGAs Memory Interface Solutions v1.9 and v1.9a—User Guide, Mar. 20, 2013.*
(Continued)

*Primary Examiner* — Aniss Chad
(74) *Attorney, Agent, or Firm* — Muncy, Geissler, Olds & Lowe, P.C.

(57) ABSTRACT

A method for generating FPGA code based on an FPGA model with at least one signal value that is modeled as a constant. A constant is inserted with a predefined signal value in the FPGA model. A switching variable is set in the FPGA model for switching between a normal mode and a calibration mode for the FPGA code. The FPGA code is generated for the FPGA model having the implementation of the constants in the FPGA code, wherein the implementation of the constants when the switching variable is set for normal mode includes the implementation of the constants as a fixed value in the FPGA code, and the implementation of the constants when the switching variable is set for calibration mode includes the implementation of the constants as a modifiable signal value in the FPGA code. A method for calibrating an FPGA model is also provided.

14 Claims, 8 Drawing Sheets

(56) References Cited

U.S. PATENT DOCUMENTS

| | | | |
|---|---|---|---|
| 7,296,054 B2 * | 11/2007 | Menter | G05B 19/0426 |
| | | | 703/2 |
| 7,900,168 B2 | 3/2011 | Chugh et al. | |
| 2004/0148151 A1 | 7/2004 | Menter et al. | |
| 2006/0140501 A1 * | 6/2006 | Tadas | G06T 5/20 |
| | | | 382/260 |
| 2011/0055449 A1 | 3/2011 | Koch et al. | |

OTHER PUBLICATIONS

European Search Report for European Application No. 14174904.4 dated Dec. 23, 2014 with English translation.
Altera, "In-System Modification of Memory and Constants," Quartus II Handbook v. 13.1, pp. 1-6 (Jun. 2012).
Xilinx, Virtex-5 FPGA Configuration User Guide v.3.11, pp. 1-166 (Oct. 19, 2012).
Xilinx, Virtex-6 FPGA Configuration User Guide v.3.6, pp. 1-182 (Apr. 18, 2013).
Xilinx, 7 Series FPGAs Configuration User Guide v.1.6, pp. 1-134 (Jan. 2, 2013).
Emo Eto, Xilinx, XAPP290 v.2.0. Difference-Based Partial Reconfiguration, pp. 1-11 (Dec. 3, 2007).

* cited by examiner

IMPLEMENTING A CONSTANT IN FPGA CODE

This nonprovisional application claims priority under 35 U.S.C. § 119(a) to European Patent Application No. EP 14174904.4, which was filed on Jun. 30, 2014, and which is herein incorporated by reference.

BACKGROUND OF THE INVENTION

Field of the Invention

The present invention relates to a method for generating FPGA code based on an FPGA model with at least one signal value that is modeled as a constant. In addition, the invention relates to a method for calibrating an FPGA model. The invention also relates to a computer program product with computer-implemented instructions that executes the steps of the above method after loading and execution in a suitable data processing device. In addition, the invention relates to a digital storage medium with control signals that are read out electronically and that can interact with a programmable data processing device in such a manner that the above method is carried out on the data processing device.

Description of the Background Art

Real-time simulations of complex, dynamic models place high demands on even modern computing nodes due to the tight time constraints. In automotive hardware-in-the-loop simulations (HIL), such models are used primarily where fast control loops must be closed, for example for very dynamic parts of the environment model. This is the case, for instance, in the simulation of cylinder pressure sensors, which play an ever greater role in reducing fuel consumption and exhaust emissions. However, short cycle times and low latencies are indispensable for highly dynamic controlled systems as well, such as electric motors, for example. These are virtually impossible to achieve in practice now with CPU-based simulations. The field of Rapid Control Prototyping (RCP) represents another example. Field Programmable Gate Arrays (FPGA) are becoming increasingly dominant in such cases in order to continue to ensure sufficiently precise and rapid reaction times by the models. In this way, the simulated environment models (e.g., simulated electric motor) or the control units can be implemented reliably, for example in that complex controller components are moved out into the FPGA. Hence the simulated environment models can become ever more precise and complex.

FPGAs can support computing nodes in real-time simulation by taking over the calculation of dynamic components of a model. Even rigorous real-time demands can be met with ease through the use of FPGAs due to the high flexibility and the capability of parallel processing of signals. The FPGAs can serve as hardware accelerators for CPUs of computing nodes. For example, the DS5203-FPGA board from dSPACE represents one such extension for an HIL simulator. Accordingly, very dynamic components of the environment model are moved out into the FPGA, for example, so that sufficiently precise and fast reaction times continue to be ensured for the control unit. An FPGA hardware configuration is typically generated in a build process based on an FPGA model in a hardware description language.

Due to increasing requirements for precision, the models of controlled systems are becoming increasingly complex, and thus also difficult to manage. In the automotive HIL environment, such models are generally produced with the Matlab/Simulink tool set from The MathWorks Inc. Simulink offers a block-based view of such models in the form of a block diagram. Model components can be combined into subsystems in a block diagram, and connected to one another with signals. The flow of data between these blocks is represented by signal lines.

In a CPU-based real-time simulation, the block diagram of a model is first translated into C/C++ source files with the aid of the Simulink Coder. These files are then translated by a compiler into an executable application that can be executed on a computing node with a real-time-capable operating system. In addition, a trace file is produced during the CPU build, which represents a topology file with its graphical modeling, for example in Simulink.

The translation of a model into a CPU application has the result that the calculations of the simulation are executed sequentially, at a fixed step size. In this way, a consistent image of all model states or model variables, such as, e.g., data on the signal lines or input/output values of the blocks, is always present in the main memory of the computing node. As a result of the direct access to main memory, the model variables can be analyzed and/or manipulated at the runtime of the model in an experimentation tool such as, e.g., ControlDesk. Random read/write access to variables of the HIL simulation is possible. Using the trace file, signal values such as engine speed can be selected and output or manipulated through a display. In the HIL environment, this procedure is summarized under the terms "measurement" and "adjustment."

An FPGA-based simulation can be modeled in a block diagram with Simulink with the aid of the Xilinx System Generator (XSG) and the FPGA Programming Blockset from dSPACE, in a manner analogous to CPU-based simulation.

In contrast to CPU simulation, however, this model is not translated into an iterative programming language, but instead into a hardware description language that describes a customer-specific digital circuit. The description of the customer-specific digital circuit is translated into an FPGA configuration data stream by a synthesis process. Thus no option exists for adjusting signals that have been placed on the FPGA. Consequently, a method that saves resources and time is desirable, particularly in the area of control unit calibration, in which a great many parameters must be set.

Calibration data are customarily modeled and implemented as constants, so modifications typically cannot be made at the runtime of the FPGA. This is entirely desirable for a final model, for example a release version or standard version, since the implementation of constants in FPGAs can be achieved simply and with few resources. Nonetheless, the process of calibration and debugging is made more difficult by the constants, since changing the signal values of the constants necessitates the generation of new FPGA code each time. A different modeling of the constants as variables could solve this problem with regard to modifying the signal values. Disadvantages with respect to the performance of the FPGA model as well as the utilization of resources ensue here, however, because of the implementation of the variables with modifiable values as FPGA code. Different implementations, for example an FPGA model using variables with modifiable values for calibration and debugging, and an FPGA model using constants with static signal values for the release, entail the disadvantage that the FPGA model must be changed for the transition to release, which is error-prone. Moreover, differences with regard to performance may result from the different modeling, with the result that errors may at times go undetected or may not occur until release of the FPGA code.

SUMMARY OF THE INVENTION

It is therefore an object of the present invention to provide a method, a data processing device, a computer program product, and a digital storage medium with control signals that are read out electronically that allow easy and efficient generation of FPGA code, that achieve a high degree of freedom from errors in the creation of FPGA code, and that allow easy and efficient use of the FPGA code for development, in particular calibration. The invention specifies a method, a data processing device, a computer program product, and a digital storage medium with control signals that are read out electronically that allow easy and efficient development, in particular calibration of FPGA code.

According to an exemplary embodiment of the invention, a method is thus provided for generating FPGA code based on an FPGA model with at least one signal value that is modeled as a constant, comprising the following steps: insertion of a constant with a predefined signal value in the FPGA model, setting of a switching variable in the FPGA model for switching between a normal mode and a calibration mode for the FPGA code, generating the FPGA code for the FPGA model comprising the implementation of the constants in the FPGA code, wherein the implementation of the constants when the switching variable is set for normal mode comprises the implementation of the constants as a fixed value in the FPGA code, and the implementation of the constants when the switching variable is set for calibration mode comprises the implementation of the constants as a modifiable signal value in the FPGA code.

According to an embodiment, a data processing device with a processor unit is also specified, wherein the data processing device is configured to carry out the above method.

Also, according to an embodiment is a computer program product with computer-implemented instructions that executes the steps of the above method after loading and execution in a suitable data processing device.

A digital storage medium is provided with control signals that are read out electronically and that can interact with a programmable data processing device in such a manner that the above method is executed on the data processing device.

An embodiment of the present invention permits simple switching between the normal mode and the calibration mode via the switching variable in the FPGA model so that the generated FPGA code can be adapted easily and efficiently for the mode in question. Consequently, a single FPGA model can be used without structural changes both for calibration and for later use in normal operation. Thus, a different implementation of the constants takes place in the FPGA code as a function of the switching variable that is set.

Starting from an FPGA model, the FPGA code for the normal mode can be generated for efficient implementation, whereas the FPGA code for the calibration mode has great flexibility for calibration or the like, for example for efficient determination of calibration values for the final FPGA code.

The implementation as a fixed value can correspond here to the standard implementation of the code generation tools for constants. Thus no requirements are made on the code generation tools for the implementation here.

The implementation of the constants as a modifiable signal value can be accomplished in a variety of ways. Details on this are given below. In this context, the signal values can be modified directly if the signal values are implemented essentially in "plaintext" in the FPGA. Alternatively, the implementation can require a translation of information from the FPGA code into the signal value to take place. This depends on the manner in which the constant is implemented as a modifiable signal value in the FPGA code. A translation specification can be established during the course of generation of the FPGA code, so that modifications to the modifiable signal value can be made reliably even at runtime of the FPGA.

In an embodiment, the modifiable signal value can be readable as well. This implementation of the FPGA code makes it possible to read out the current signal value at any given time, for example in order to store it during a successful calibration and use it later, for instance for defining the signal value of the constant in normal mode. The signal value can be readable, for instance, when its value is output directly or indirectly to an I/O port or when the configuration bits that define the value in the FPGA can be read out through a readback mechanism. The readback mechanism can be used when the value of the constant is implemented in a register, for example.

The switching variable can have a preset for a calibration mode. This is based on the assumption that generation of the FPGA code for the calibration mode takes place initially, so accordingly the switching variable only has to be set for normal mode, which is to say that an active modification of the switching variables by the user is only required when the FPGA code for normal mode is to be generated.

In an embodiment of the invention, the step of inserting a switching variable in the FPGA model for switching between a normal mode and a calibration mode comprises the assignment of the switching variable to at least one constant. This is advantageous when different parts of the FPGA model are to be calibrated, and the calibration can take place independently. Since only some of the constants are provided as a modifiable signal value in the FPGA code, the FPGA code can be provided while using fewer FPGA resources, such as I/O ports. A plurality of constants can be configured through one switching variable, which is to say that the implementation of a plurality of constants is determined by one switching variable. An assignment of constants to one switching variable can take place based on a defined group of constants. The assignment of switching variable and constants can take place starting from the constants or from the switching variable in the FPGA model. For example, the switching variable can apply for all constants in a subsystem of the FPGA model. Alternatively, the switching variable is executed as a global switching variable, so that the implementation of all constants can be controlled by the setting of one switching variable.

In an embodiment of the invention, the step of implementing the constants as a modifiable signal value comprises implementation of the constants with registers. The use of registers makes it possible to access the modifiable signal value in a simple way for the purpose of modifying the signal value. The same applies to a possible readout of the modifiable signal value. As a result of the implementation of the constant with registers, the modifiable signal value can be accessed in "plaintext," as it were, so that a complex conversion of a signal value to the FPGA code can be dispensed with.

In an embodiment of the invention, the step of implementing the constants as a modifiable signal value in the FPGA code comprises the implementation of FPGA components and/or signal paths for setting the modifiable signal value. By this means, the modifiable signal value can be set reliably. The FPGA components can be variously implemented, as stated below. As a matter of principle, existing components can also be used by the means that their signal values, for example along signal paths, are used as modifiable signal values. Normally, however, the modifiable signal values are transferred to an FPGA board from outside for execution of the FPGA code.

In an embodiment of the invention, the step of implementing FPGA components and/or signal paths for setting the modifiable signal value comprises the implementation and connection of an I/O port for setting the modifiable signal value in the FPGA code. Consequently, the modifiable signal values can be transferred to an FPGA board from outside for execution of the FPGA code, by the means that the modifiable signal values are provided through the I/O ports. Readout of the modifiable signal values can also be accomplished in a simple manner through the I/O ports. When registers are used for implementation of the constant as a modifiable signal value, the I/O ports can be connected directly to the registers, for example, in order to modify the register contents. To this end, after the application of a signal value through the I/O ports, for example, an enable signal can be applied to the registers in order to import the signal value from the I/O ports into the registers as a modifiable signal value.

In an embodiment of the invention, the step of implementing FPGA components and/or signal paths for setting the modifiable signal value comprises the implementation of a shift register for setting the modifiable signal value in the FPGA code. The shift register makes it possible to provide essentially any desired signal values through one or a few I/O ports by the means that individual bits of the signal value are transmitted sequentially. Because of the high speed of implementation as FPGA code, any delays that may occur due to sequential transmission are typically negligible. Advantages arise from the fact that shift registers require low resource overhead, and simple scaling can be accomplished for different modifiable signal values. Scaling for a large number of constants can also be accomplished easily.

In an embodiment of the invention, the step of implementing FPGA components and/or signal paths for setting the modifiable signal value comprises the implementation of a multiplexer for setting the modifiable signal value in the FPGA code. By means of multiplexers, signal values can be provided in parallel by one or more I/O ports, and imported as a modifiable signal value. Consequently the signal value can be imported directly, and delays can be reduced to a minimum.

In an embodiment of the invention, for constants the FPGA model distinguishes between at least one fixed value block and at least one calibration block, wherein the value of the at least one constant block is implemented as a fixed value in the FPGA code independently of the switching variables, and the value of the at least one calibration block can be implemented as a fixed value in normal mode and as a modifiable signal value in calibration mode depending on the switching variables.

In addition, a method for calibrating an FPGA model is specified according to the invention, comprising the following steps: generation of FPGA code based on an FPGA model with at least one signal value that is modeled as a constant, wherein the switching variable is set for calibration mode; calibration of the FPGA code comprising the setting of a plurality of signal values for the modifiable signal value; establishing a signal value as the calibration value for the constant; implementation of the calibration value for the constant in the FPGA model; generation of FPGA code based on the FPGA model with the calibration value for the constant, wherein the switching variable is set for normal mode.

Also provided according to the invention is a data processing device with a processor unit and an FPGA, wherein the data processing device is configured to carry out the above method.

Also provided according to the invention is a computer program product with computer-implemented instructions that executes the steps of the above method after loading and execution in a suitable data processing device.

Also provided is a digital storage medium with control signals that are read out electronically and that can interact with a programmable data processing device in such a manner that the above method is executed on the data processing device.

Here, too, in an embodiment, a basic idea is to be able to carry out efficient calibration or the like through the use of an FPGA model together with the switching variables, without the need to modify the FPGA model.

Following successful calibration, final FPGA code can be generated using the FPGA model as a starting point, by setting the switching variables for normal mode. The calibration value for the constant is incorporated in this process. Consequently, sources of error such as arise principally in the modification of an FPGA model are eliminated.

Depending on the implementation in FPGA code, the modification of the modifiable signal values can take place directly if the signal values are implemented essentially in "plaintext" in the FPGA. This depends on the manner in which the constant is implemented as a modifiable signal value in the FPGA code.

Otherwise, a translation specification is necessary in order to set a signal value for the modifiable signal value. The translation specification can be established during the generation of the FPGA code, so that it is available for execution of the FPGA code and permits modification of the modifiable signal value. An example of a translation specification is a relationship between the signal value and the configuration of one or more logic elements of the FPGA, such as, e.g., multiplexers or look-up tables.

Implementation of the FPGA code with signal values as constants in calibration mode thus makes it possible to reliably make modifications to the modifiable signal value at the runtime of the FPGA. The regeneration of the FPGA code that is otherwise necessary, which is very time-consuming, can be dispensed with. Nor is it necessary to modify the FPGA model in order to perform the calibration.

In an embodiment of the invention, the method comprises the additional step of storing a signal value from the FPGA code in the FPGA model. As a result, the signal value can be imported directly from the FPGA code into the FPGA model so that fully calibrated FPGA code can be generated in a simple manner and with little effort. For example, a user can select a signal value to be stored, or automatic selection of the signal takes place wherein multiple signal values that are employed are taken into account. The selection can be carried out by a host computer or a computing node to which an FPGA board is connected for execution of the FPGA code. To this end, higher-level software for establishing a signal value as the calibration value for the constant can be executed on this host computer or computing node. In addition, automatic storage of modifications to modifiable signal values can take place.

In an embodiment of the invention, the step of determining a signal value as a calibration value for the constant comprises the automatic importing of a current signal value from the FPGA code into the FPGA model. Thus, for example, calibration values can be imported such as are contained in the FPGA code as signal values for the modifiable signal values at the end of the calibration. Hence, the signal values existing upon termination of the calibration can be imported as calibration values, for example.

In an embodiment of the invention, the method can include the additional step of connecting an FPGA board for executing the generated FPGA code to a control unit, in particular a real-time control unit.

As a result, the calibration can take place in interaction with the control unit.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
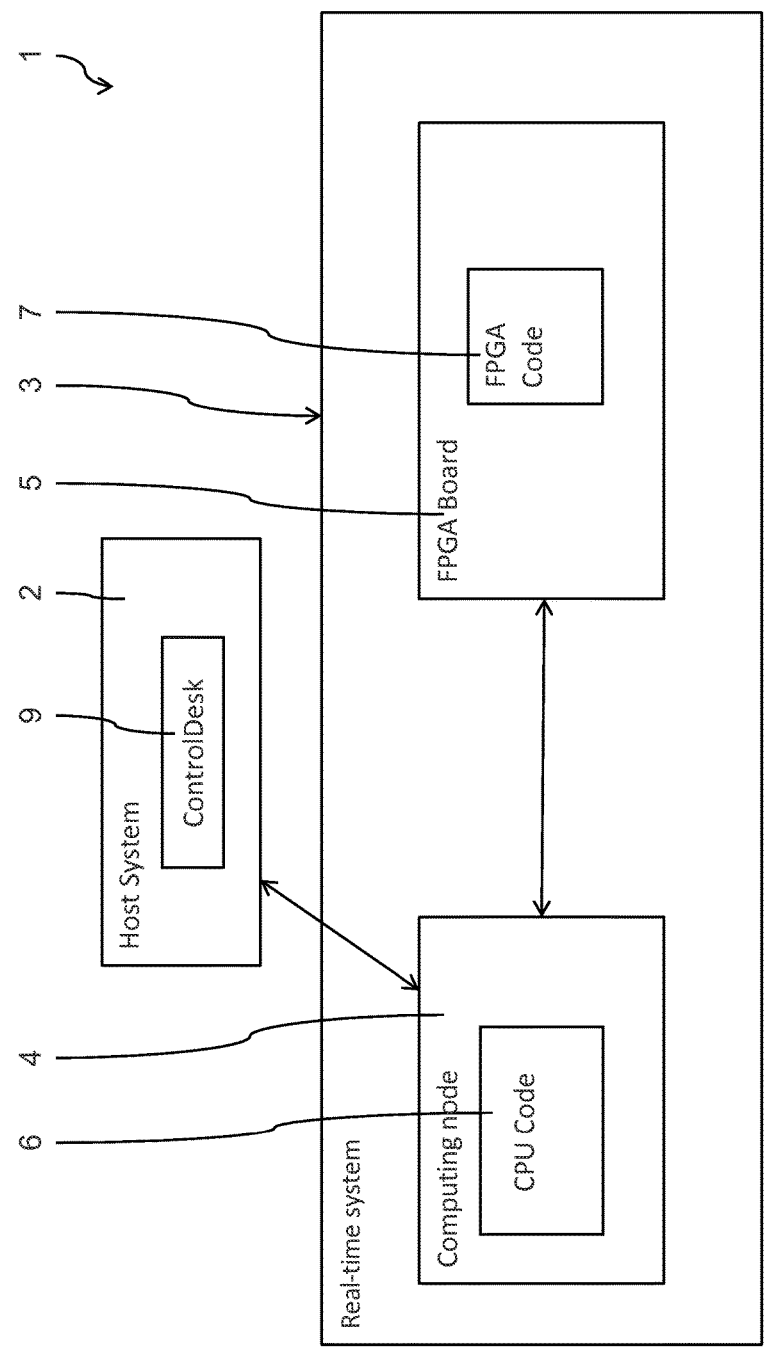
FIG. 1 is a schematic view of a data processing system with a control computer and a real-time system.

FIG. 1 shows a configuration according to the invention of a data processing system 1 with a control computer 2, here also labeled as host system, and a real-time system 3. The real-time system 3 is connected to the control computer 2 through a network connection that is not explicitly shown.

The real-time system 3 comprises a computing node 4 with a CPU that is not shown, and an FPGA board 5, which in this example embodiment is a Xilinx FPGA. The real-time system 3 here is any desired data processing device upon which a CPU application is executed as CPU code 6. FPGA code 7 is executed on the FPGA board 5. The FPGA board 5 is implemented with a plurality of I/O ports 8.

Control software 9 is executed on the control computer 2; in this example embodiment it is dSPACE ControlDesk software. The ControlDesk 9 communicates with the real-time system 3 through the computing node 4, as shown in FIG. 1.

Figure 2:
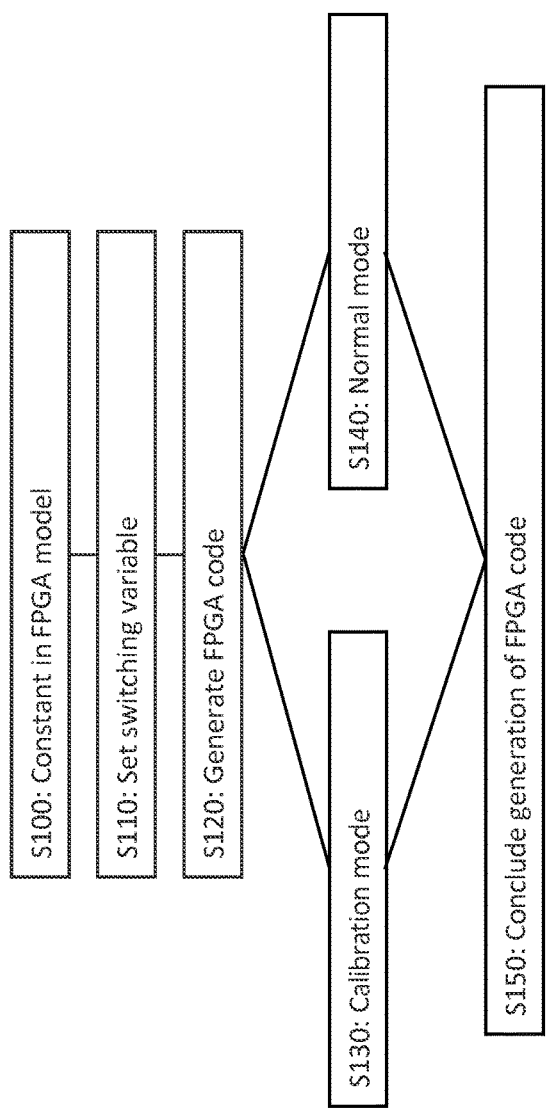
FIG. 2 is a flowchart of a method for generating FPGA code according to an embodiment.
Figure 3:
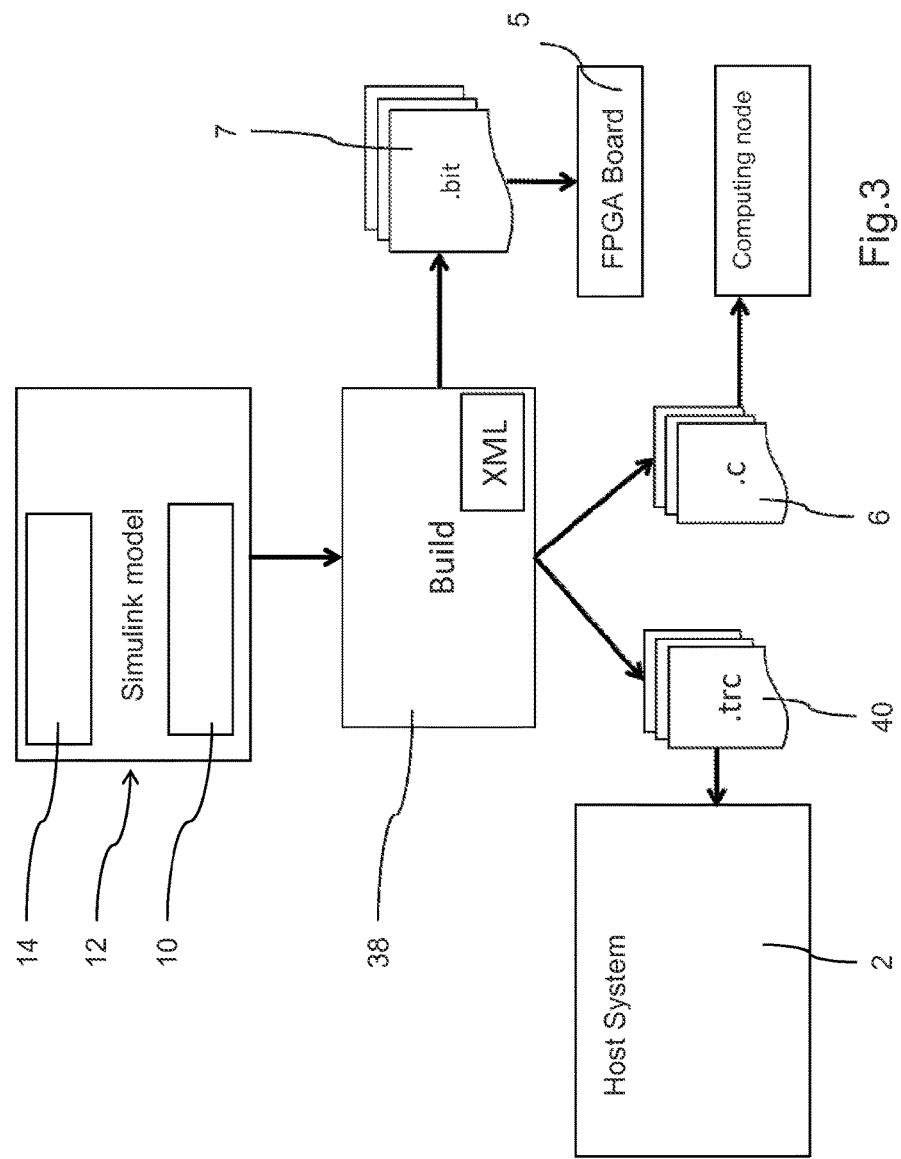
FIG. 3 is a schematic view of a build process for generating models for different components of the data processing system from FIG. 1.

FIG. 2 shows a method for generating the FPGA code based on an FPGA model 10 with at least one signal value that is modeled as a constant, according to an exemplary embodiment. The FPGA model 10 is part of a Simulink model 12, which additionally comprises a CPU model 14, as shown in FIG. 3. The FPGA model 10 and the CPU model 14 together represent the desired behavior of the real-time system 3, wherein it is the FPGA model 10 and its implementation that is considered in detail here.

Figure 4:
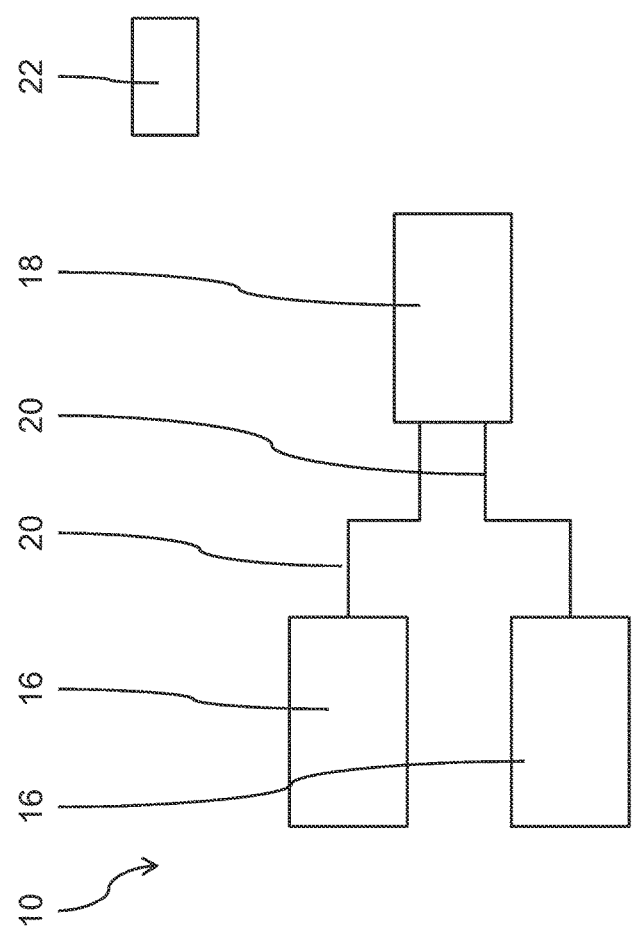
FIG. 4 is a simplified, schematic view of an FPGA model with constants.

The method starts with step S100. In step S100, a constant 16 with a predefined signal value is inserted in the FPGA model 10. The FPGA model 10 is shown in a simplified, schematic view in FIG. 4, and includes here by way of example an additional constant 16 and additional components that are represented jointly here as user logic 18. The constants 16 and the user logic 18 are connected to one another through signal paths 20 as shown. In addition, the FPGA model 10 includes a switching variable 22, which is set globally for the FPGA model 10 and applies to both constants 16. The switching variable 22 can be switched between a normal mode and a calibration mode.

In step S110, the switching variable 22 is set globally for the FPGA model 10. Calibration mode is preset.

In step S120, the FPGA code 7 for the FPGA model 10 is generated. In this process, the constants 16 are implemented differently in the FPGA code 7 as a function of the value that has been set for the switching variable 22.

Figure 5:
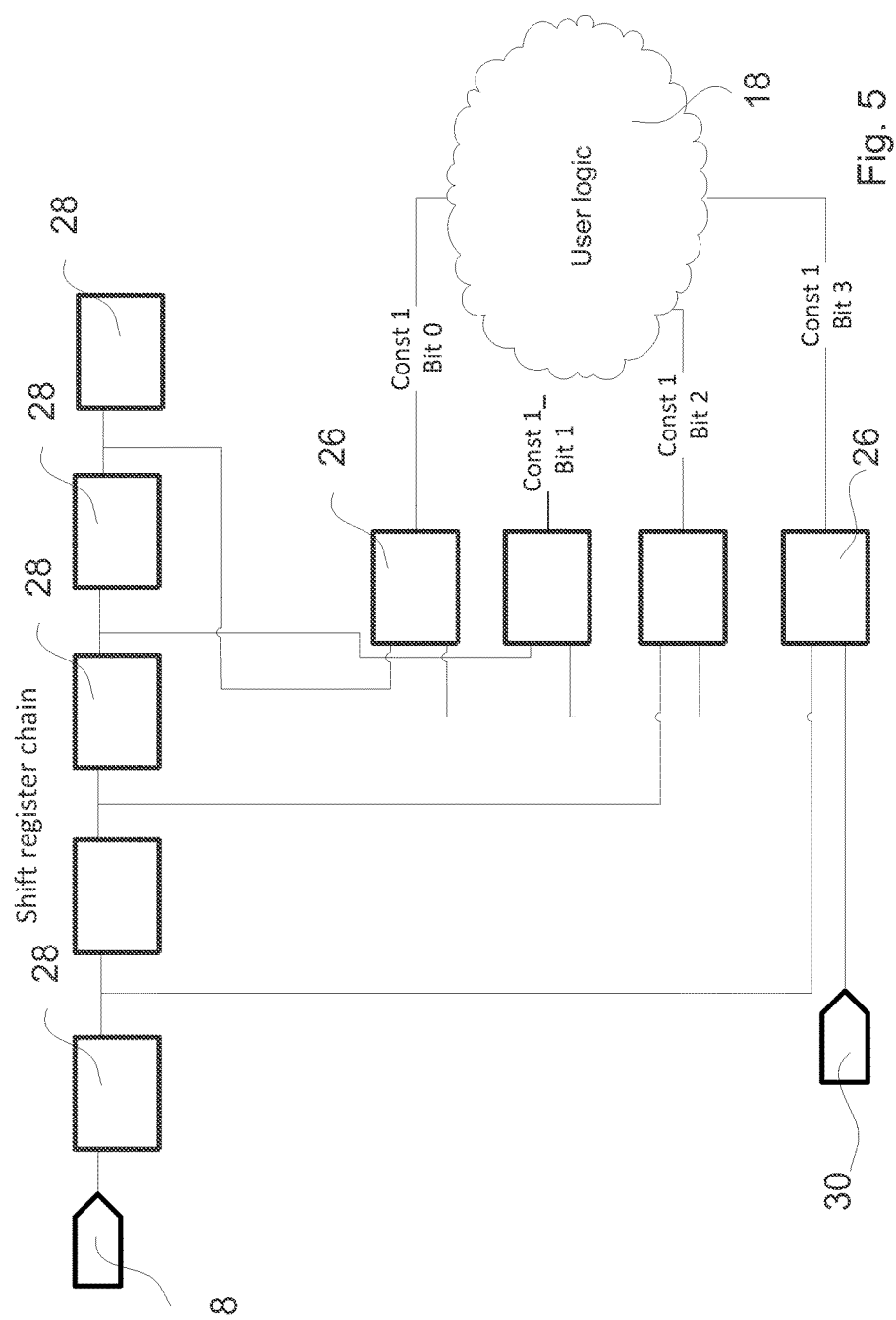
FIG. 5 is a schematic view of an implementation of a modifiable signal value in FPGA code with registers.

In step S130, if the switching variable 22 is set for calibration mode the constants 16 are implemented in the FPGA code 7 as modifiable signal values 24. To this end, the constants 16 are implemented with registers 26, as is shown by way of example for a constant 16 in FIG. 5. Each register 26 corresponds to one bit of the modifiable signal value 24 here.

Additional FPGA components 28, 30 in the form of shift registers 28 and an enable signal 30, as well as connecting signal paths 32 for setting the modifiable signal value 24, are also implemented here and are connected to the I/O port 8. Signal values can thus be loaded sequentially from outside through the I/O port 8 into the shift registers 28, and transferred from there into the registers 26 through the enable signal 30. The signal value is thus transferred in a bitwise manner.

The implementation of the modifiable signal value 24 with registers 26 also makes it possible to read out the modifiable signal value 24 through structures that are not shown here.

In an alternative embodiment, the implementation of the constants 16 as a modifiable signal value 24 comprises a plurality of I/O ports 8 that are connected directly to the registers 26. By means of the enable signal 30, after the application of a signal value through the I/O ports 8, the signal value from the I/O ports 8 is imported into the registers 26 as a modifiable signal value 24.

Figure 6:
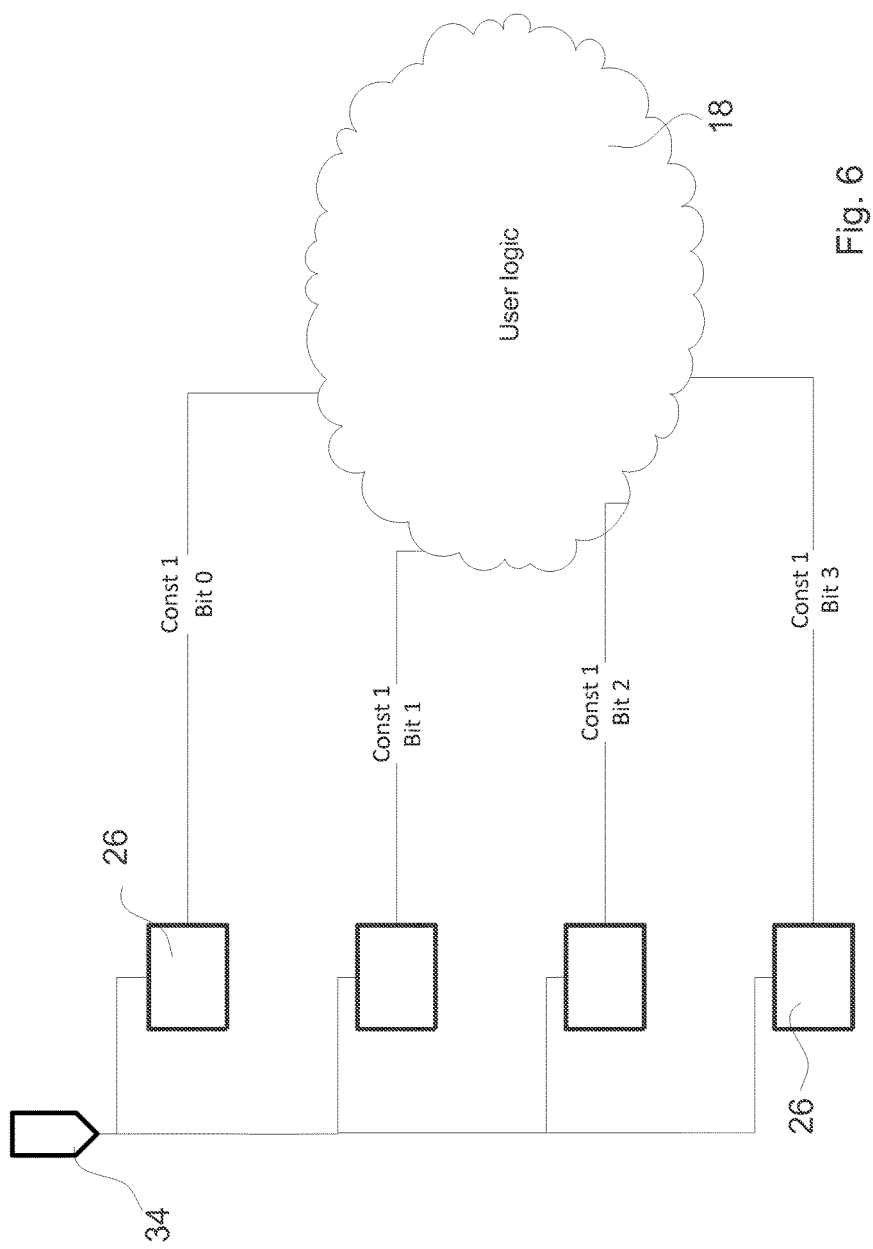
FIG. 6 is a schematic view of an implementation of a signal value that can be modified through partial reconfiguration in FPGA code with registers.

In another alternative embodiment, which is shown in FIG. 6, the registers 26, which represent the values of the constants, are written through partial reconfiguration. New values for the registers 26 are written in the configuration level of the FPGA by means of partial reconfiguration, and are imported from the configuration level to the functional level of the FPGA, which is to say imported as current values of the register 26, through the application of a reset signal 34. This makes it possible to cut down on connections to I/O ports 8.

The method subsequently branches to step S150.

Figure 8:
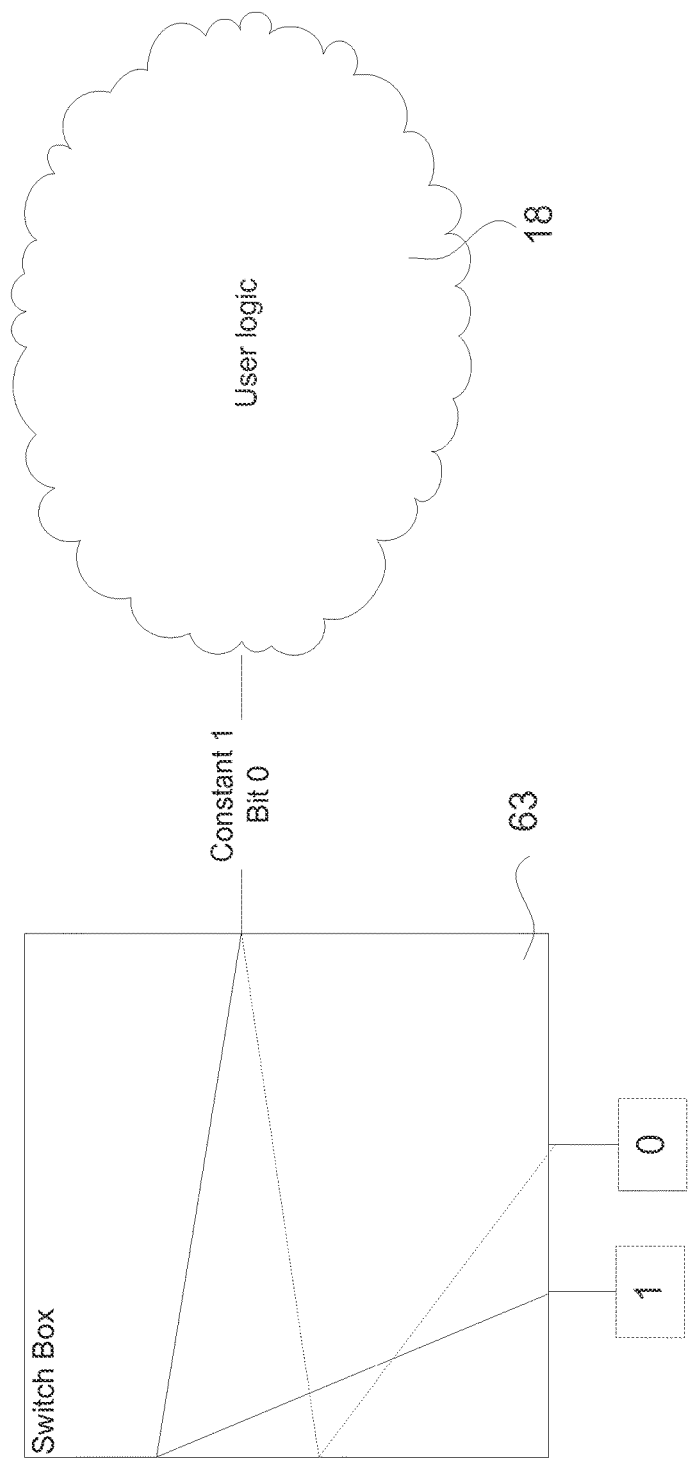
FIG. 8 is a schematic view of an implementation of a fixed value.

In step S140, with the switching value 22 set for normal mode, the constants 16 are implemented as fixed values in the FPGA code 7. An exemplary implementation of a fixed value is shown in FIG. 8. Here, the value is determined by direct wiring to 0 or 1 or the corresponding voltages. The method subsequently branches to step S150.

In step S150, generation of the FPGA code 7 is concluded. Details are shown in FIG. 3. Executable code is generated from the Simulink model 12 by a build 38. This comprises generation of the FPGA code 7 as an FPGA hardware configuration, generation of the CPU code 6 for the part of the Simulink model 12 that is executed on the computing node 4, and generation of software components 40 for the control computer 2.

Figure 7:
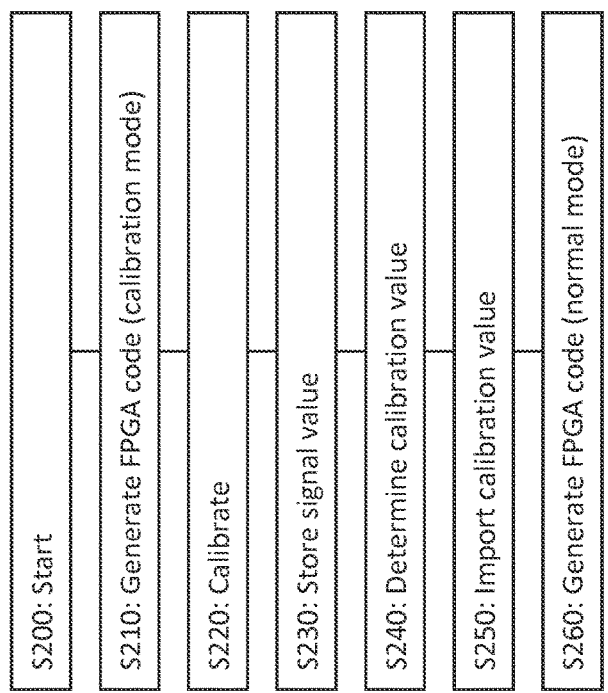
FIG. 7 is a flowchart of a method for calibrating an FPGA model according to an exemplary embodiment.

FIG. 7 shows a method for calibrating an FPGA model 10. The method starts with step S200.

In step S210 the aforementioned method is carried out that is described with reference to FIG. 2 for generation of FPGA code 7 based on an FPGA model 10 with at least one signal value that is modeled as a constant 16. In step S210, the switching variable for calibration mode is set.

In step S220, the calibration of the FPGA code 7 is performed. Accordingly, as described above, a plurality of signal values for the modifiable signal value 24 are transferred to the FPGA board 5 through the I/O port 8 and imported for the modifiable signal value 24.

In step S230, signal values from the FPGA code 7 for the two modifiable signal values 24 are stored in the FPGA model for subsequent use. Step S230 can be carried out repeatedly for suitable calibration values.

In step S240, signal values are determined as calibration values for the constants 16. This includes the automatic importing of a current signal value from the FPGA code 7 into the FPGA model 10 at the end of the calibration.

In step S250, the calibration values for the constants 16 are imported into the FPGA model 10. The FPGA model 10 as such remains unchanged as this occurs.

In step S260, the aforementioned method for generating the FPGA code 7 as described with reference to FIG. 2 is carried out again. In this case, however, the FPGA model 10 with the constants 16 already exists as it was generated in step 210, so this part of the method is not carried out again. In step S260, the switching variable 22 is set for normal mode. Consequently, the FPGA code 7 can be generated with the desired calibration values.

The method is implemented as a computer program product with computer-implemented instructions that executes the steps of the above method after loading and execution in the real-time system 3.

A digital storage medium provides control signals that are read out electronically and that interact with the real-time system 3 in such a manner that the above method is executed on the real-time system 3.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for generating FPGA code based on an FPGA model with at least one signal value that is modeled as a constant, the method comprising:
    inserting a constant with a predefined signal value into the FPGA model;
    setting a switching variable in the FPGA model for switching between a normal mode and a calibration mode of the FPGA code, the normal mode being code segments of the FPGA code optimized for efficient implementation and the calibration mode being code segments of the FPGA code optimized for flexibility; and
    generating the FPGA code for the FPGA model that implements the constant in the FPGA code,
    wherein implementation of the constant, when the switching variable is set for normal mode, comprises implementing the constant as a fixed value in the FPGA code,
    wherein implementation of the constant, when the switching variable is set for calibration mode, comprises implementing the constant as a modifiable signal value in the FPGA code,
    wherein, when the switching variable is set for the calibration mode, at least one calibration block of variables is modifiable via an I/O port in the calibration mode, the at least one calibration block of variables comprising the constant, and
    wherein, if the switching variable is switched from calibration mode to normal mode, the at least one calibration block of variables becomes fixed constants.

2. The method according to claim 1, wherein the step of inserting a switching variable in the FPGA model for switching between the normal mode and the calibration mode comprises assignment of the switching variable to at least one constant.

3. The method according to claim 1, wherein the step of implementing the constant as a modifiable signal value comprises implementation of the constant as registers.

4. The method according to claim 1, wherein the step of implementing the constant as a modifiable signal value in the FPGA code comprises implementation of FPGA components and/or signal paths for setting the modifiable signal value.

5. The method according to claim 4, wherein the step of implementing FPGA components and/or signal paths for setting the modifiable signal value comprises implementation and connection of the I/O port for setting the modifiable signal value in the FPGA code.

6. The method according to claim 4, wherein the step of implementing FPGA components and/or signal paths for setting the modifiable signal value comprises implementation of a shift register for setting the modifiable signal value in the FPGA code.

7. The method according to claim 4, wherein the step of implementing FPGA components and/or signal paths for setting the modifiable signal value comprises implementation of a multiplexer for setting the modifiable signal value in the FPGA code.

8. The method according to claim 1, wherein, for the constant, the FPGA model distinguishes between at least one fixed value block and the at least one calibration block, wherein the at least one fixed value block has a fixed value in the FPGA code independent of the switching variable, and wherein the at least one calibration block has a fixed value in the normal mode and has a modifiable signal value in the calibration mode depending on the switching variable.

9. A data processing device with a processor, wherein the data processing device is configured to carry out the method according to claim 1.

10. A non-transitory computer program product with computer-implemented instructions that executes the steps of the method according to claim 1 after being loaded and executed in a data processing device.

11. A non-transitory digital storage medium with control signals that are read out electronically and that interact with a programmable data processing device such that the method according to claim 1 is executed on the programmable data processing device.

12. A method for calibration of an FPGA model, the method comprising:
generating FPGA code based on an FPGA model with at least one signal value that is modeled as a constant, wherein a switching variable is set for a calibration mode;
calibrating the FPGA code comprising setting a plurality of signal values resulting in a modifiable signal value;
establishing a signal value as a calibration value for the constant;
implementing the calibration value for the constant in the FPGA model; and
generating the FPGA code based on the FPGA model with the calibration value for the constant, wherein the switching variable is set for a normal mode,
wherein the step of establishing the signal value as the calibration value for the constant comprises the automatic importing of a current signal value from the FPGA code into the FPGA model.

13. The method according to claim 12, further comprising: storing the signal value from the FPGA code in the FPGA model.

14. The method according to claim 12, further comprising connecting an FPGA board for executing the FPGA code that has been generated and transmitted to a control unit or a real-time control unit.

* * * * *